United States Patent
Daftari et al.

Patent Number: 5,779,502
Date of Patent: Jul. 14, 1998

[54] SOCKET INTEGRATING HIGH FREQUENCY CAPACITOR ASSEMBLY

[75] Inventors: Reza E. Daftari, Irvine; Bao G. Le, Orange, both of Calif.

[73] Assignee: AST Research, Irvine, Calif.

[21] Appl. No.: 485,188

[22] Filed: Jun. 6, 1995

[51] Int. Cl.⁶ .................................................. H01R 13/66
[52] U.S. Cl. .................................................. 439/620
[58] Field of Search .............................. 439/69, 620, 70, 439/108, 109

[56] References Cited

U.S. PATENT DOCUMENTS

| | | |
|---|---|---|
| 4,072,380 | 2/1978 | Freehauf . |
| 4,405,188 | 9/1983 | Schwartz ................................. 439/70 |
| 5,456,616 | 10/1995 | Fuerst et al. ............................ 439/620 |

*Primary Examiner*—Neil Abrams
*Assistant Examiner*—Christopher Goins
*Attorney, Agent, or Firm*—Henry G. Kohlman

[57] ABSTRACT

In an integrated circuit socket an integrating capacitor filter carried on a mylar film or integral with said socket incorporated into the top of an integrated circuit socket electrically connected to the voltage and ground connecting pins or electrodes of the integrated circuit in as close as proximity to the entry point into the integrated circuit as is possible. This reduces the lead distance between the entry point in the integrated circuit including CPU integrated circuits at both the voltage and ground connection and the capacitive element to a minimum and minimizes interference in the power source by minimizing inductance in capacitor leads experienced in high speed electrical circuits. It is particular useful in minimizing electrical interference in the voltage applied to CPU by incorporating the capacitive element directly into the CPU socket so that it is electrically coupled between the voltage pin and the ground pin of the CPU in close proximity to the entry point in the CPU.

14 Claims, 6 Drawing Sheets

SOCKET INTEGRATING HIGH FREQUENCY CAPACITOR ASSEMBLY

BACKGROUND OF THE INVENTION

1. Field of the Invention

This invention relates to electrical devices used to minimize oscillations in electrical circuits. More specifically this invention relates to capacitive devices used to eliminate or minimize oscillations in the power source of high frequency CPU's relative to ground which are incorporated into the circuit near or on the integrated circuit socket.

2. Description of Related Art

The related art is replete with various electrical devices used for filtering electrical lines and terminating electrical signal paths to eliminate reflection and undesirable signals in electrical circuits. including computer circuits. In particular, CPU power and ground traces coupled by discrete capacitors which filters unwanted high frequency signals to ground. However, as CPU cycles and therefore frequencies increase, the physical dimensions of traces on circuit boards becomes a limiting factor and causes inductance to appear in the circuit. This inductance interferes with the ability of the capacitor to filter unwanted signals to ground. That is. the effective resistance in series with the capacitor increases with a resulting degradation of the capacitor's ability to filter such signals as frequency increases. As a result the CPU may and often does experience data faults due to fluctuations in the power source which changes the threshold levels for the bit signals being processed by the CPU causing loss of data through erroneous signal level evaluation.

The related art has placed discrete capacitors across the voltage and ground pins on circuit board traces remote from the socket and in some cases beneath the CPU socket primarily in an attempt to conserve circuit board real estate. However, the length of the leads of the capacitor to the point of connection relative to the CPU pins also results in unwanted inductance at high CPU cycles because the length of the leads is extended by the electrical conductive paths in the socket and the CPU connecting pins or electrodes.

The instance invention provides a capacitor filter incorporated into the CPU socket with an electrical connection to the voltage and ground connecting pins or electrodes of a CPU being as short as is possible. This reduces the conductive lead distance between the entry point in the CPU at both the voltage and ground connection and the capacitive element to a minimum and minimizes interference in the CPU power source.

SUMMARY OF THE INVENTION

The instant invention is carrier in the form of a mylar film, for carrying a plurality of capacitors, which is insertable into an integrated circuit socket and electrically coupled to the voltage and ground connecting pins or electrodes of the integrated circuit inserted into the socket. This places the capacitive element in as close a proximity to the entry point into the integrated circuit as is possible and provides electrical coupling between the voltage and ground connecting pins of the CPU. The reduced lead distance between the entry point in the CPU at both the voltage and ground connections and the capacitive element minimizes interference in the power source caused by induction in high frequency electrical circuits. The instant invention is particular useful in minimizing electrical interference in the voltage applied to CPU by incorporating the capacitive element directly into the CPU socket so that it is electrically coupled between the voltage pin and the ground pin of the CPU in close proximity to the CPU integrated circuit.

The object of this invention is to provide an a plurality of capacitors for filtering unwanted oscillations in the power source applied to central processing units.

Another object of this invention is to provide a convenient apparatus for adding capacitive filters to electrical circuits.

Another object of this invention is to provide a carrier for a plurality of integrating or filtering capacitors which holds the capacitors in a desired physical relationship for connection between respective voltage and ground connecting pins.

Other objects will be readily apparent to those skilled in the art and the scope of this invention is not limited by the foregoing.

DESCRIPTION OF THE PREFERRED EMBODIMENT(S)

Figure 1:
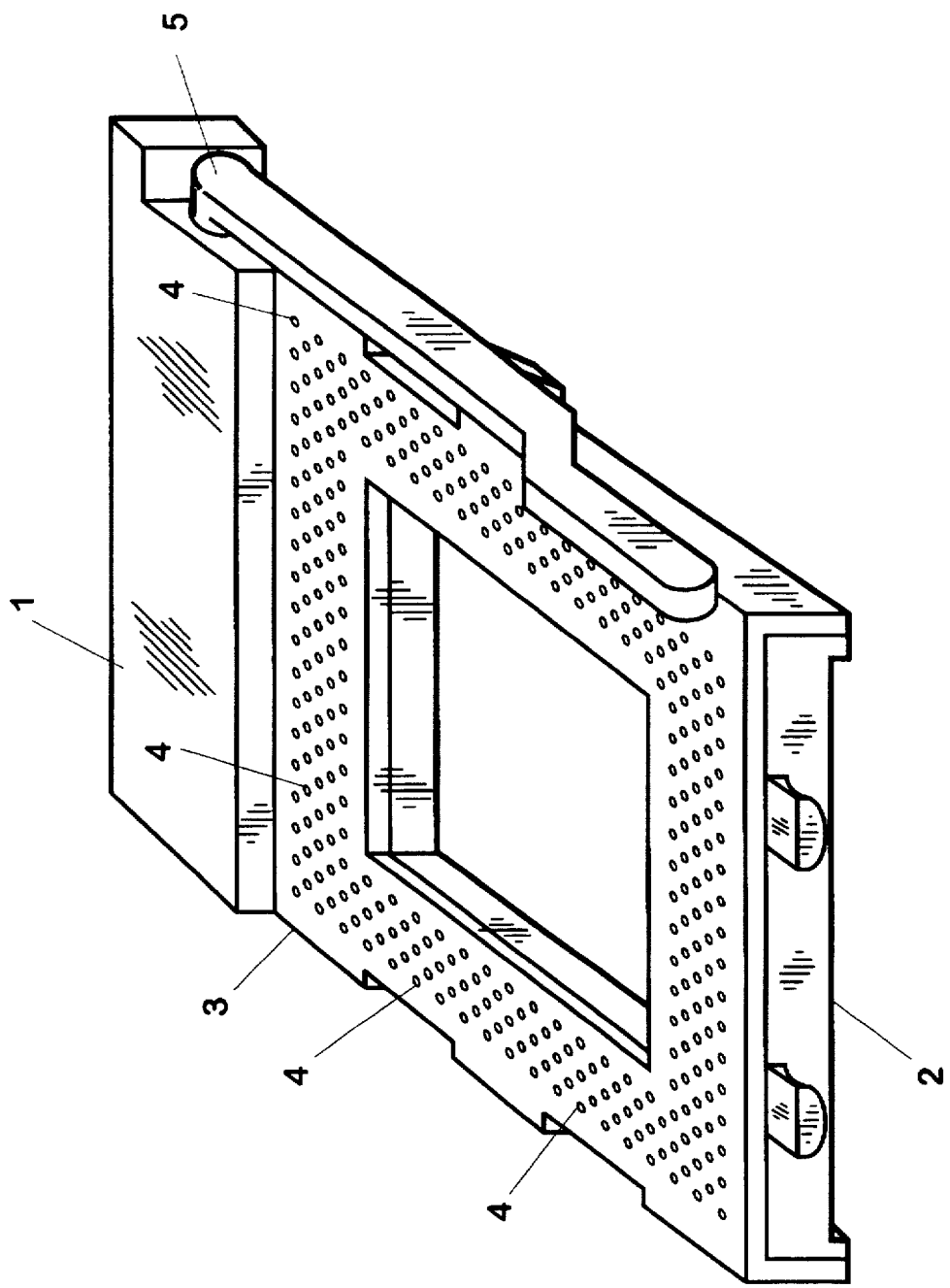
FIG. 1 is a perspective view of a typical CPU socket.

FIG. 1 shows integrated circuit CPU Socket 1 having a base 2, and an upper section 3. The upper section 3 has a plurality of pinholes 4 (not all of which are provided with the reference numeral (4) for clarity). A handle 5 is provided which shifts the position of the upper section 3 relative to the base 2 and locks the connecting pins of the CPU chip into position.

Figures 2A, 2B:
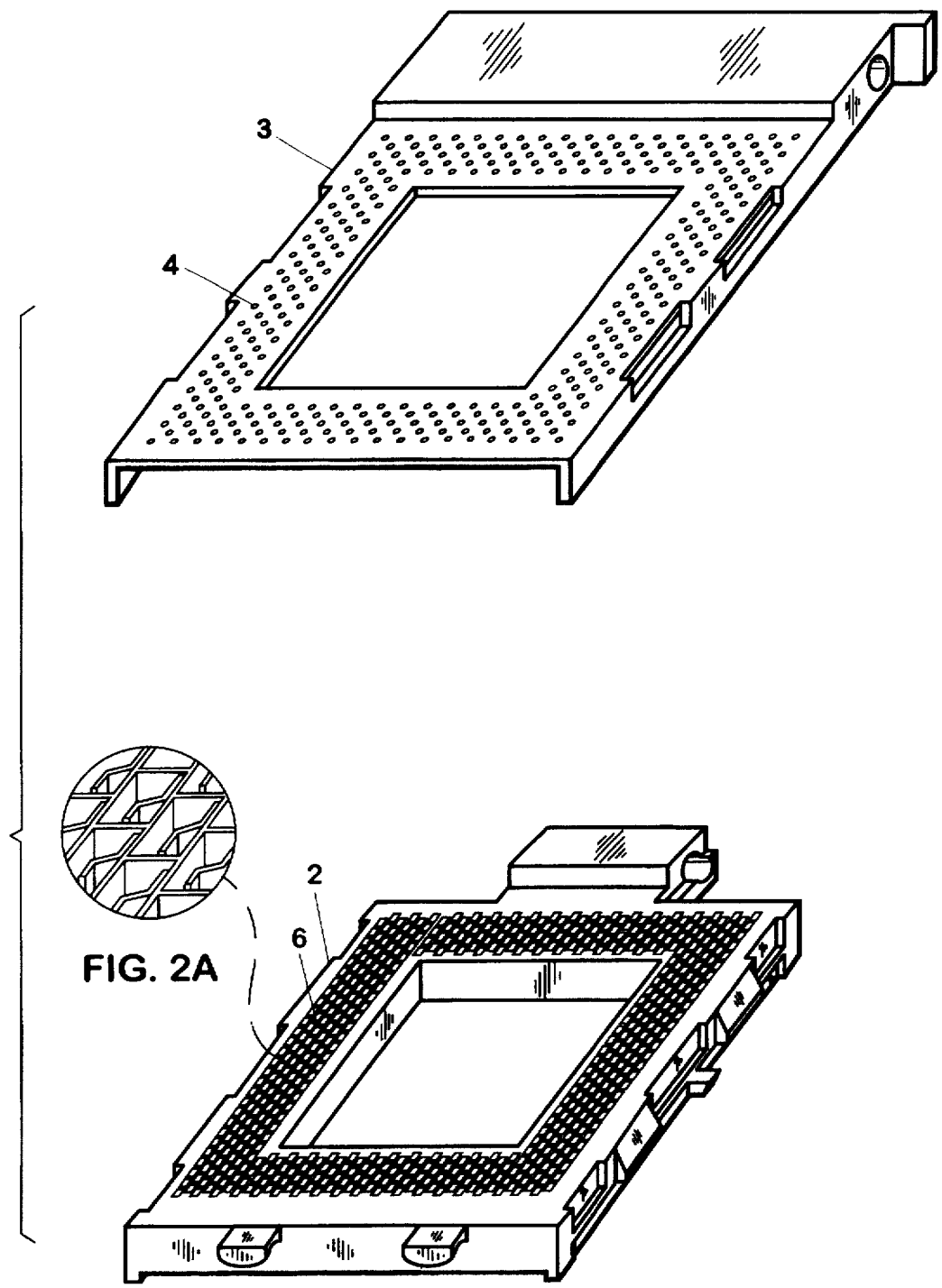
FIG. 2A is an enlarged view of a portion of the base of the socket showing the connectors.
FIG. 2B is an exploded view of the upper section of the CPU socket and the base.

Most CPU sockets 1 are formed from at least an upper section 3 and a base 2 as shown in FIG. 2 which are then snapped together. The base carries the socket connecting pins or electrodes 6 in the holes 4 of the base. The particular CPU socket used in the example of this invention is a P54C socket for an Intel PENTIUM processor or equivalent. Many other socket configurations of various sizes and shapes are available for different integrated circuit chips and this invention is not limited to the PENTIUM processor or equivalent. Each CPU integrated circuit has a unique pin position which is set forth in the specifications of the pinout for the particular CPU. In this example, the pinouts of the $V_{cc}$ and $V_{ss}$ connecting pins for the Intel PENTIUM processor or equivalent are shown in the Tables I and II respectively set forth below.

TABLE I

| Vcc | | | | | | | |
|---|---|---|---|---|---|---|---|
| A07 | A21 | G37 | N37 | U33 | AA37 | AN09 | AN23 |
| A09 | A23 | J01 | Q01 | U37 | AC01 | AN11 | AN25 |

TABLE I-continued

| Vcc | | | | | | | |
|-----|-----|-----|-----|-----|-----|-----|-----|
| A11 | A25 | J37 | Q37 | W01 | AC37 | AN13 | AN27 |
| A13 | A27 | L01 | S01 | W37 | AE01 | AN15 | AN29 |
| A15 | A29 | L33 | S37 | Y01 | AE37 | AN17 | |
| A17 | E37 | L37 | T34 | Y37 | AG01 | AN19 | |
| A19 | G01 | N01 | U01 | AA01 | AG37 | AN21 | |

TABLE 2

| Vss | | | | | | | |
|-----|-----|-----|-----|-----|-----|-----|-----|
| B06 | B20 | K02 | R36 | X36 | AF02 | AM12 | AM26 |
| B08 | B22 | K36 | T02 | Z02 | AF36 | AM14 | AM28 |
| B10 | B24 | M02 | T36 | Z36 | AH02 | AM16 | AM30 |
| B12 | B26 | M36 | U35 | AB02 | AJ37 | AM18 | AM37 |
| B14 | B28 | P02 | V02 | AB36 | AL37 | AM20 | |
| B16 | H02 | P36 | V36 | AD02 | AM08 | AM22 | |
| B18 | H36 | R02 | X02 | AD36 | AM10 | AM24 | |

Figure 3:
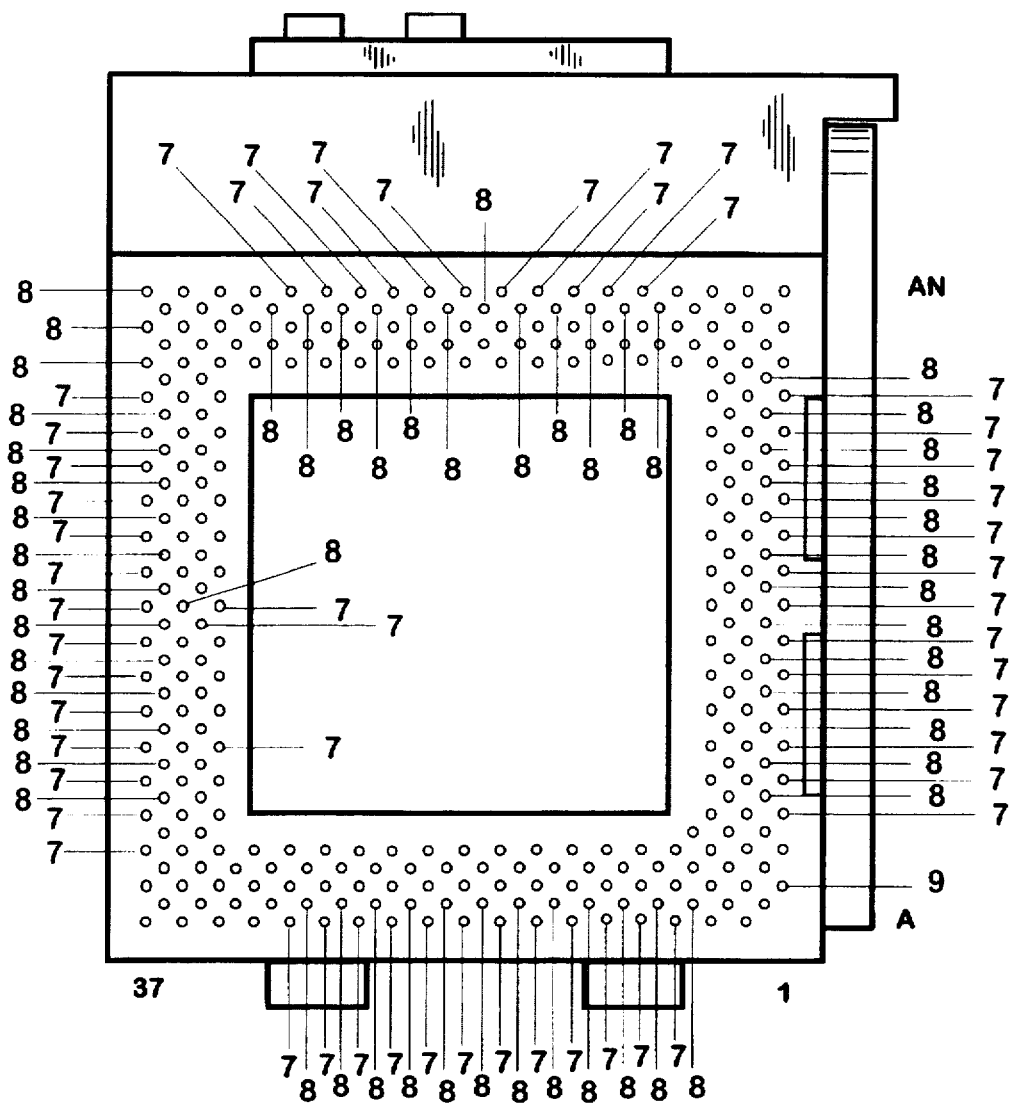
FIG. 3 is a top view of an CPU Integrated Circuit Socket with row and column designations.

The various CPU connecting pins and the pin holes on the CPU socket are designated by a alphanumeric code. In this particular case, the Intel P54C pinout is characterized by numerals from 1–37 and alpha designations from A–H, J–N, P–Z, AA–AH, and AJ–AN for 37 alpha designations. With reference to FIG. 3, the numeric designations looking down from the top are as follows numeral (1) designates the first column of connecting pins and the numeral (37) designates the last column on the far left. The alpha character (A) designates the first row of pin holes beginning at the bottom to the alpha character (AN) designates the last row at the top. Accordingly, the pin hole designated as reference numeral 9 on the lower right hand side of FIG. 3 designates pinhole C1 by this nomenclature. As shown on FIG. 3, this socket has fifty three $V_{cc}$ or voltage pin holes 7 and fifty three $V_{ss}$ or ground pin holes 8, spaced about the periphery of the socket which correspond to the $V_{cc}$ and $V_{ss}$ connecting pins of the CPU. In operation, these connecting pins are electrically isolated and no filter protection is provided at the CPU connecting pins. Integrating capacitor filtering of the power source is often performed on the circuit board or in some cases below the socket 1 in order to conserve printed circuit board real estate. However, as the CPU cycles increase as pointed out above, long leads represented by the current state of the art creates an unwanted inductance which interferes with the ability of the capacitors to reduce interference on the supply voltage connecting pins $V_{cc}$.

Figure 4B:
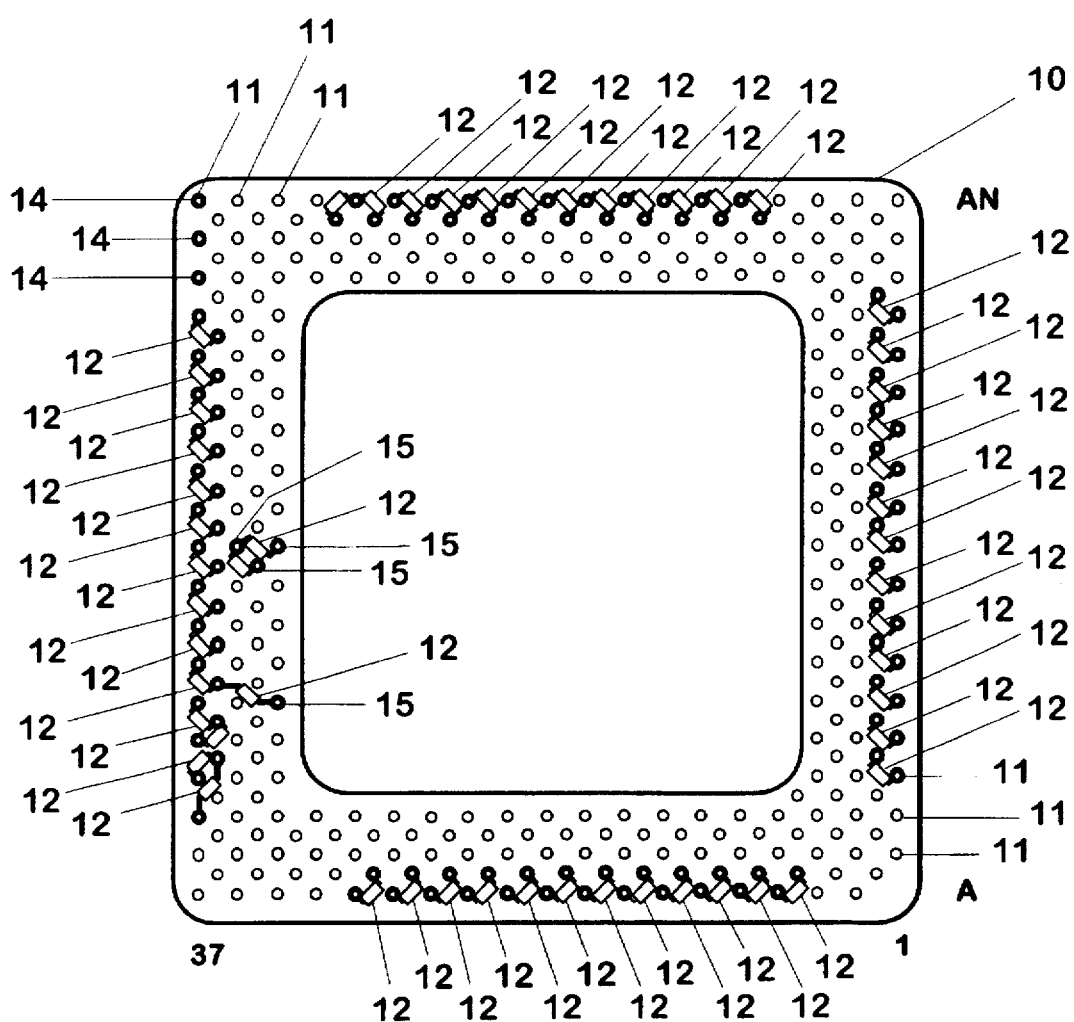
FIG. 4B is top down view of the mylar film carrying a plurality of capacitors.
Figure 4A:
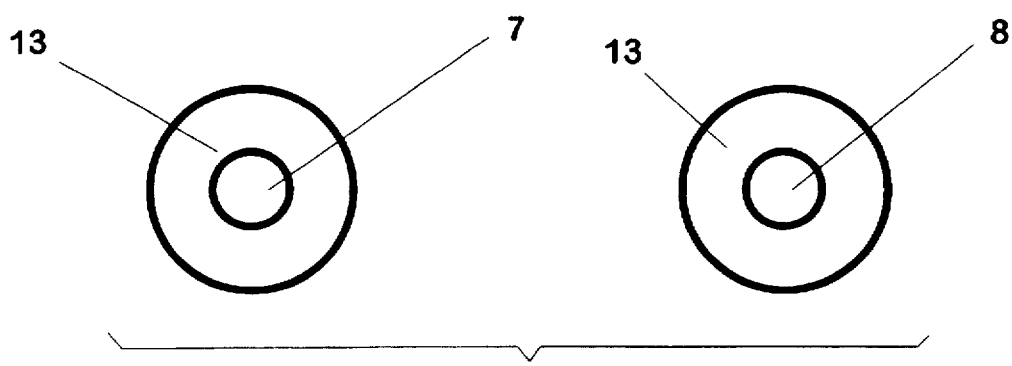
FIG. 4A is a view of the voltage and ground pin holes with electrically conductive surfaces.

This has been resolved in the instant invention by providing a plurality of capacitors, each of which is electrically coupled between respective voltage, $V_{cc}$ connecting pins 7 and ground, $V_{ss}$ connecting pins 8 of the socket at or near the pin entrance into the CPU. This is accomplished by as shown in FIG. 4, by mounting these capacitors on a carrier which is a mylar film 10 having a plurality of holes 11 (not all are designated with the numeral (11) for clarity) which correspond to the pins of the CPU and the holes in the socket. The dimensions of the mylar film 10 are such that in will fit within the dimensions of the CPU socket 1. As shown in FIG. 4 and FIG. 4A, the holes at the $V_{cc}$ connecting pins 7 and $V_{ss}$ connecting pins 8 are provided with a electrically conductive surfaces 13 about the periphery thereof and up to the edge and through the hole such that when a connecting pin is inserted into the hole electrical contact is established between the pin and the electrically conductive surface 13. Each capacitor 12 is mounted on the mylar film and electrically connected to the electrically conductive surface 13 of the mylar film 10 at the pin holes 7 for voltage, $V_{cc}$ and the pinholes 8 for ground, $V_{ss}$ capacitive coupling is thereby established between each $V_{cc}$ hole and a nearby $V_{ss}$ hole as shown in FIG. 4.

The capacitors 12 are mounted between each pair of $V_{cc}$ pinholes 7 and $V_{ss}$ pinholes 8 and connected to the conductive material 13 attached to the mylar film 10. However, certain of the $V_{cc}$ connecting pins 7 and $V_{ss}$ connecting pins 8 do not have closely matching pairs as determined from the pinout tables. This leaves $V_{ss}$ connecting pins 14 near the top and to the left of FIG. 4 without respective connections to a nearby $V_{cc}$ pin 7. The unmatched $V_{cc}$ 15 connecting pins are connected to their nearest ground pin 8 in order to minimize lead length. This means that certain $V_{cc}$ connecting pins 7 will be sharing ground connecting pins 8. In this particular example, at least 3 unmatched $V_{cc}$ connecting pins 15 will be sharing ground connecting pins 8 as shown on the left side of FIG. 4.

The capacitors 12, typically in the range of 1 microfarad for a 100 Hz CPU are thereby electrically coupled between the voltage pinhole $V_{cc}$ 7 and the ground pinhole $V_{ss}$ 8.

Figure 5:
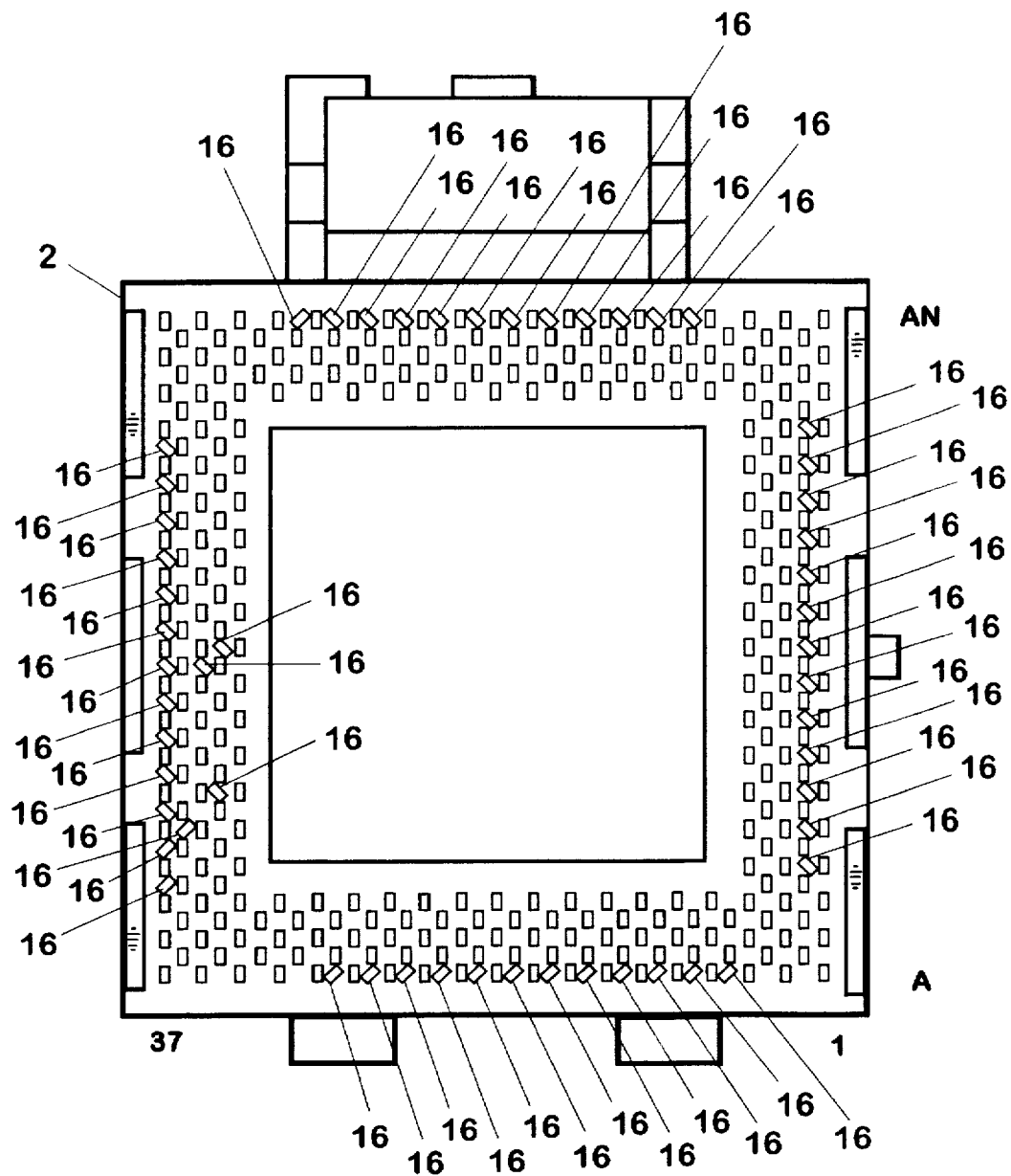
FIG. 5 is a top down view of the CPU socket base without the upper section thereof removed.
Figure 6:
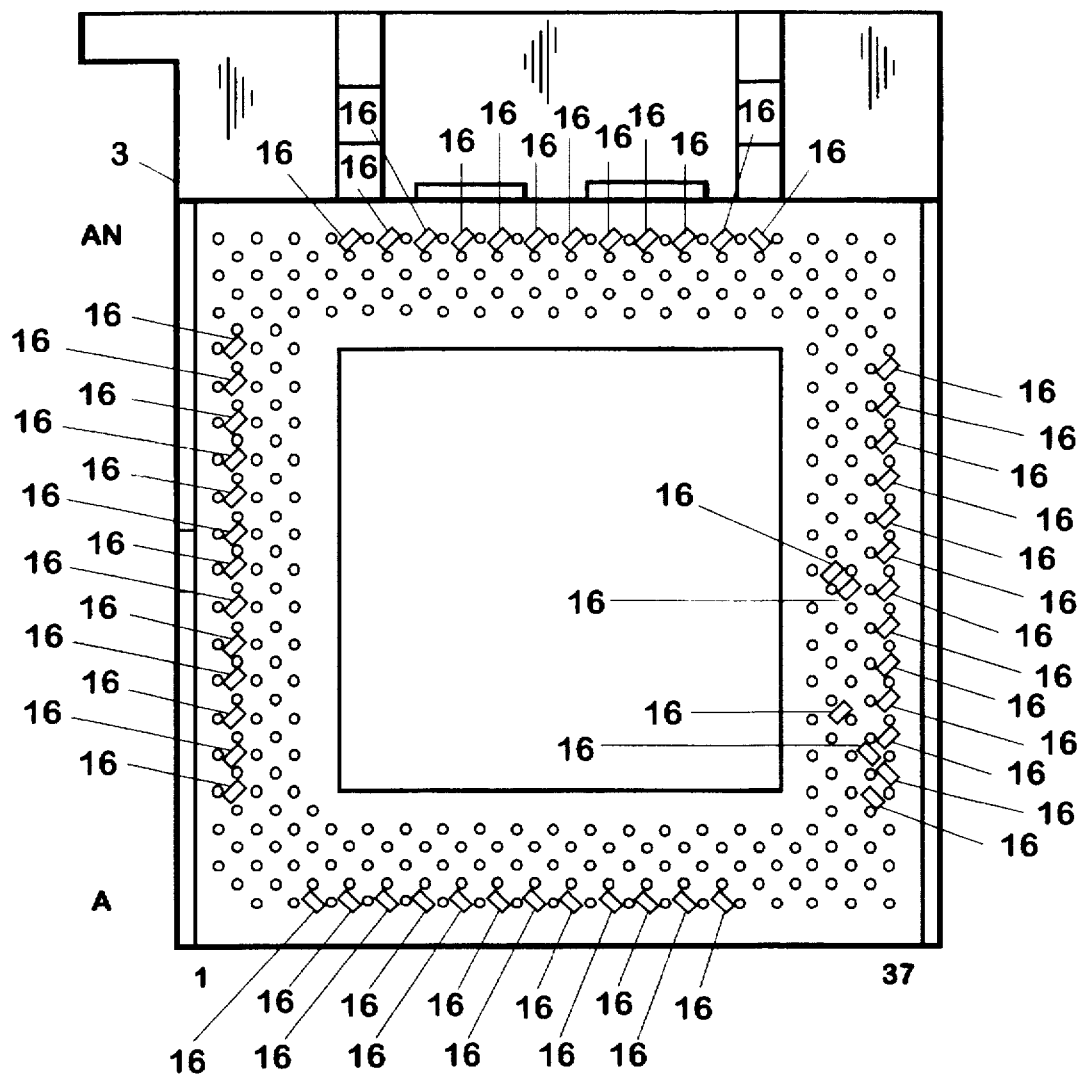
FIG. 6 is a bottom up view of the upper section of the CPU socket showing recesses.

The mylar film 10 shown in FIG. 4 is not conductive and is sufficiently thin so that it may be sandwiched between the upper section 3 and the base 4 of the CPU socket 1. Capacitors 12 size should be selected so as to permit insertion of the capacitors 12 between socket holes as shown in the FIG. 4. While the capacitors 12 in today's technology products are quite small, they still have a relatively significant physical size which does not permit them to be readily inserted between the upper section 3 and the base 2 of the socket 1 as with the mylar film 10. Accordingly, the upper section 2 of the socket 1 will not be able to close into its position over the base 2 of the socket 1 without providing appropriate recesses to accommodate the capacitors 12. It should be noted that as CPU design changes the number and disposition of the various connecting pins will vary and different arrangements of the capacitors 12 and possibly the shape of the mylar film carrier will be required. In FIG. 5, a view of the base 2 of the socket 1 as viewed from above is shown. The base 2 is usually used to house the socket connecting pins the upper portion of which receive the corresponding connecting pins of the CPU. As socket size increases, recesses may be provided in the base for the capacitors. In FIG. 5, the socket 1 base 2 has a plurality of rectangular recess 16 in the upper surface thereof for receiving said capacitors 12. These recesses 16 are of sufficient size for receiving the volume of the capacitors 12 mounted on the mylar film 10. Since the mylar film 10 is flexible, the action of snapping the upper portion 3 on to the base 2 of the socket 1 will force the capacitors 12 into the recesses 16 in the base 2. Subsequent operation of the socket arm will lock the CPU in place and force the connecting pins into electrical engagement with the electrical conductive regions 13 on the mylar film 10 and the capacitors 12 which are in electrical communication therewith. Alternatively, the capacitors 12 can be mounted on the bottom of the mylar film 10 and will then insert directly into the recesses 16. The size of the recesses 16 must be configured to accommodate the volume of the capacitors 12 and the mylar film 10 or the capacitors 12 alone if mounted on the bottom of the mylar film 10. Often due to size constraints there may not be sufficient physical space between connecting pins on the top of the base 2 in which case the recesses 16 may be provided in the upper section 3 of the socket 1. FIG. 6 shows a bottom view of the upper section 3 of the socket 1 with the recesses 16 provided in the bottom of the upper portion 3 of the socket 1. However, in this view the recesses 16 are in mirror image from those recesses shown in FIG. 5 and is an alternative preferred embodiment. In fact, no recesses whatsoever is required where the mylar film 10 is mounted directly on the connecting pins of the CPU integrated circuit itself before mounting on the CPU socket 1. In that way, the CPU connecting pins or electrodes would be in direct contact with the capacitors 12 and no recesses would be required in the CPU socket 1. However, to ensure that the capacitors 12 are always in place, it is preferred to have them mounted inside the CPU socket 1 structure in close proximity to the pinholes 7 and 8 so they cannot be inadvertently removed or omitted. Finally it should be recognized that while discrete capacitors 12 are discussed in the preferred embodiment, the scope of this invention includes capacitive elements which may be deposited on the mylar film 10 directly along with the conductive elements 13.

Having thus described the invention what is claimed is:

1. An integrated circuit socket having a plurality of connecting pins adapted for receiving an integrated circuit having a plurality of integrated circuit connecting pins comprising:
   a. a base having a plurality of connecting pins adapted for receiving the connecting pins of the integrated circuit at least one of which is a voltage pin and at least one of which is a ground pin, and
   b. a capacitor electrically coupled between said voltage pin and said ground pin mounted at the top of said socket in juxtaposition with the tops of said integrated circuit connecting pins immediately adjacent the point of entry of said integrated circuit pins into said integrated circuit.

2. An integrated circuit socket as described in claim 1 further comprising a cover adapted for attachment to the upper plane of said base and wherein said base has a recess in the upper surface thereof for receiving said capacitor.

3. An integrated circuit socket as described in claim 2 wherein said capacitor is integral with said base.

4. An integrated circuit socket as described in claim 2 wherein there are a plurality of capacitors mounted on a carrier adapted for insertion into said socket between said base and said cover.

5. An integrated circuit socket as described in claim 4 wherein said carrier is a mylar film having a plurality of electrically conductive surfaces electrically coupled to said capacitors such that on insertion of said integrated circuit, each of said capacitors is electrically coupled between a voltage source pin of said integrated circuit and at least one ground pin of said integrated circuit.

6. An integrated circuit socket comprising:
   a. a base having a plurality of holes,
   b. a top adapted for attachment to the upper surface of said base having a plurality of holes which correspond to the holes of said base,
   c. a plurality of connecting pins adapted for insertion into the holes of said socket and adapted for receiving the connecting pins of said integrated circuit, and
   d. means for filtering alternating electrical signals, electrically coupled between voltage and ground connecting pins of said integrated circuit when said integrated circuit is inserted into said socket and energized.

7. An integrated circuit socket as described in claim 6 wherein said top has a recess for housing at least a portion of said means for filtering said signals.

8. An integrated circuit socket as described in claim 6 wherein there are a plurality of capacitors mounted on a carrier adapted for insertion into said socket.

9. An integrated circuit socket as described in claim 6 including a carrier comprising: a generally nonconductive film having a plurality of isolated electrically conductive surfaces thereon adapted for electrical coupling with said capacitors such that each of said capacitors is electrically coupled between a voltage source of said integrated circuit and at least one ground of said integrated circuit at a point in juxtaposition with the entry of said voltage source and said ground into said integrated circuit.

10. A carrier for supporting electrical components for filtering signals in a central processing unit comprising:
   a. a non conductive film having a plurality of holes adapted for receiving the connecting pins of said central processing unit at a point immediately adjacent the entry point of said pins into said central processing unit,
   b. a plurality of conductive elements attached to said film at voltage and ground connections for the connecting pins of said central processing unit, and
   c. means for filtering electrical signals, electrically coupled between at least two of said voltage and ground connections for the connecting pins of said central processing unit.

11. A carrier as described in claim 10 wherein said means for filtering electrical signals is a capacitor electrically coupled between at least one voltage and one ground pin of said central processing unit.

12. A carrier as described in claim 11 adapted for insertion into a socket for receiving said central processing unit.

13. An integrated circuit socket comprising:
   a. a base having a plurality of holes,
   b. a top adapted for attachment to the upper surface of said base having a plurality of holes which correspond to the holes of said base.
   c. a plurality of connecting electrodes adapted for insertion into the holes of said base and adapted for receiving the electrodes of said integrated circuit,
   d. a generally nonconductive film adapted for mounting on said socket having a plurality of electrically conductive surfaces spaced apart from one another immediately surrounding selected ones of said holes and adapted for electrical coupling to selected electrodes at a point in close proximity to the entry of said electrodes to said integrated circuit on insertion of said integrated circuit into said socket,
   e. a plurality of capacitors mounted on a said film between selected electrodes and electrically communicating with selected electrode pairs
   f. a recess for housing a plurality of said capacitors disposed in said socket between opposite polarity electrode pairs.

14. An integrated circuit socket as described in claim 13 wherein at least some of said plurality of capacitors are arranged such that each is disposed in the space between two adjacent selected ones of said holes in said carrier which holes are surrounded by electrically conductive surfaces and said capacitors are electrically coupled between said selected ones of said holes.

* * * * *